US006455884B1

(12) United States Patent
Chan et al.

(10) Patent No.: US 6,455,884 B1
(45) Date of Patent: Sep. 24, 2002

(54) RADIATION HARDENED SEMICONDUCTOR MEMORY WITH ACTIVE ISOLATION REGIONS

(75) Inventors: Tsiu Chiu Chan, Carrollton, TX (US); Antonio Imbruglia, Catania (IT); Richard Ferrant, Saint Ismier (FR)

(73) Assignees: STMicroelectronics, Inc., Carrollton, TX (US); STMicroelectronics, S.r.l (IT); STMicroelectronics, S.A. (FR)

( * ) Notice: Subject to any disclaimer, the term of this patent is extended or adjusted under 35 U.S.C. 154(b) by 3 days.

(21) Appl. No.: 09/634,233

(22) Filed: Aug. 8, 2000

(30) Foreign Application Priority Data

Oct. 22, 1999 (EP) .............................. 99410144

(51) Int. Cl.⁷ ........................................... H01L 27/108
(52) U.S. Cl. ...................... 257/296; 257/921; 438/238; 438/239; 438/386; 438/399
(58) Field of Search ................. 257/296, 921; 438/238, 239, 386, 399

(56) References Cited

U.S. PATENT DOCUMENTS

| 4,696,092 A | 9/1987 | Doering et al. ............. 438/210 |
| 5,699,291 A | * 12/1997 | Tsunemine ................... 365/149 |
| 5,973,952 A | * 10/1999 | Crafts ........................... 365/53 |
| 6,091,630 A | * 7/2000 | Chan et al. .................. 365/156 |

FOREIGN PATENT DOCUMENTS

| EP | 0 324 225 A2 | 7/1989 |
| EP | 0 607 583 A2 | 7/1994 |
| JP | 03016170 | 1/1991 |
| JP | 03230564 | 10/1991 |
| JP | 03274762 | 12/1991 |
| WO | 98/48460 | 10/1998 |

* cited by examiner

Primary Examiner—Nathan J. Flynn
Assistant Examiner—Scott R Wilson
(74) Attorney, Agent, or Firm—David V. Carlson; Lisa K. Jorgenson

(57) ABSTRACT

A radiation hardened memory device includes active gate isolation structures placed in series with conventional oxide isolation regions between the active regions of a memory cell array. The active gate isolation structure includes a gate oxide and polycrystalline silicon gate layer electrically coupled to a voltage potential resulting in an active gate isolation structure that prevents a conductive channel extending from adjacent active regions from forming. The gate oxide of the active gate isolation structures is relatively thin compared to the conventional oxide isolation regions and thus, will be less susceptible to any adverse influence from trapped charges caused by radiation exposure.

32 Claims, 4 Drawing Sheets

RADIATION HARDENED SEMICONDUCTOR MEMORY WITH ACTIVE ISOLATION REGIONS

TECHNICAL FIELD

The present invention relates generally to semiconductor memory devices, and more particularly, to a radiation hardened semiconductor dynamic random access memory cell.

BACKGROUND OF THE INVENTION

Semiconductor memory devices used in outer space, for example, in a satellite, are subjected to severe environmental conditions that may compromise the integrity of the stored data, or cause the memory devices to fail. In many cases, the memory devices are part of a larger embedded system, where the memory device is just one of many devices sharing the same die. An embedded system may typically include a microprocessor executing instructions and embedded memory for storing instructions and data. The integrity of the memory devices used in outer space applications is critical because the information stored by the memory devices may be related to critical functions, such as guidance, positioning, and transmitting and receiving data from a ground base station. Furthermore, semiconductor memory devices for use in space applications should remain functional for the lifetime of the satellite, which may be as long as several years. Contrast this with applications where the memory devices are also subjected to harsh operating conditions, such as guidance systems in missiles, but only for a relatively short time period.

One cause of errors in semiconductor memory devices that are used in outer space applications is due to high-energy particles impinging on the memory device. There are several forms of high energy particles in outer space. For example, there are alpha particles and gamma rays, to name a couple. These high-energy particles strike the semiconductor material on which the memory devices are formed with enough energy to cause the generation of electron-hole pairs. The resulting charge carriers are often trapped in the various oxide layers of the memory devices. In the case of metal oxide semiconductor ("MOS") transistors, charges trapped in the gate oxide will shift the threshold voltage, Vt, of the transistor. As a result, leakage currents of the transistors, and consequently, of the memory devices may increase. Where the transistor is used as a transfer gate for a conventional memory cell, the increased leakage current may compromise the integrity of the data stored by the data storage node, such as a capacitor, by allowing the charge representing the data to dissipate.

The frequency or number of charges trapped in an oxide layer is proportional to the thickness of the oxide layer. Consequently, oxides having a greater thickness will, on the average, have a greater number of trapped charges. In the case where the oxide is relatively thick, for example, approximately 4000–5000 Å, charge trapped in the oxide will result in a much more dramatic shift in the leakage current characteristics than for an active transistor having a relatively thin gate oxide. Such an application of thick oxide is for isolating active transistor areas in which memory cells may be formed, for example, regions of local oxidation of silicon ("LOCOS"). The accumulating charge trapped in the LOCOS region may become great enough to cause a conduction channel to form below the LOCOS region, and consequently allow current to leak between neighboring active transistor regions.

As mentioned previously, transistors in the active region of a memory device, which typically have gate oxides that are much thinner than the oxides of the LOCOS region, will have shifting Vts as a result of the trapped charges in the gate oxide. A method that has been used to accommodate the shifting Vts is to raise the Vts of the active transistors so that the relative changes in the Vts due to the trapped charges are minor. Thus, the effect that trapped charges will have on the overall performance of the memory devices is minimized. However, the aforementioned technique is not as effective when applied to LOCOS isolation regions. Although the Vt of the incidental transistor of the LOCOS isolation regions may be adjusted so that the Vt shift due to charge trapped in the thick oxide is relatively small, the resulting isolation region will have an unacceptably low breakdown voltage.

Another technique used to accommodate charge trapped in a thick LOCOS isolation region is to create a two-layer oxide isolation structure. A relatively thin layer of oxide of approximately 500 Å is grown in the isolation region, followed by the formation of a relatively thick layer of phosphorous doped oxide of approximately 4000 Å over the relatively thin layer of oxide. The phosphorous doped oxide is subsequently densified by baking. The resulting structure minimizes the effect trapped positive charges have on the leakage characteristics of the isolation region by neutralizing the trapped positive charges with the abundance of electrons of the relatively thick phosphorous doped oxide. However, this approach is limited by the doping concentration of the relatively thick oxide layer. That is, the greater the level of impurities, the greater the diffusion of the impurities from the thick oxide into the adjacent layers.

Another approach taken in providing semiconductor memory devices suitable for use in space applications is through a method of trial and error. Samples of potentially applicable semiconductor memory devices are taken from several different process lots and subjected to severe radiation conditions that simulate the environment of outer space. The sample devices are subsequently tested for functionality and reliability. Those memory devices from the process lots having samples surviving the testing are judged to be acceptable for use in applications in outer space. However, this approach merely screens existing memory devices for those which may be sufficient for use in outer space applications, and consequently, the quantity of satisfactory memory devices produced by this method is subject to the unpredictable nature of semiconductor processing.

Therefore, there is a need for a semiconductor memory device having reliable data retention over a sufficiently long period of time for use in applications subjected to severe radiation environments, such as outer space.

SUMMARY OF THE INVENTION

According to the present invention, a semiconductor memory includes dynamic random access memory ("DRAM") cells formed on a substrate and arranged in a matrix where each memory cell includes a data storage node that is selectively coupled through a transfer gate to a sense node. The data storage node is electrically isolated from the data storage nodes of adjacent memory cells by an active gate isolation structure formed in series with an oxide isolation region. The active gate isolation structure is coupled to a voltage potential to prevent a conductive channel extending between the data storage nodes of adjacent memory cells from forming.

DETAILED DESCRIPTION OF THE INVENTION

Embodiments according to the present invention uses an active gate isolation structure formed in series with a thick field isolation structure to reduce leakage currents in a semiconductor memory cell array. The technique is described herein with respect to radiation hardened dynamic random access memory ("DRAM") cells. Data storage nodes of a memory device are isolated from one another using an active gate isolation structure formed adjacent to a thick field oxide isolation structure. The resulting isolation between the data storage nodes is formed by the active gate isolation structure being in series with the adjacent thick field oxide isolation structures. The active gate is tied to a voltage potential to prevent a conductive channel from forming under the active gate isolation structure. Embodiments of the memory cell structure described herein may be used in a variety of memory applications, such as embedded memories, as well as discrete memory devices, and the like.

The thickness of the oxide of the active gate isolation structure is relatively thin compared to the thickness of the thick field oxide isolation structures and will trap less charge when the semiconductor memory device is exposed to radiation. Consequently, the probability of accumulating trapped charge in the oxide of the active gate isolation structure gate sufficient to create an inversion layer is reduced. Although charge trapped in the thick field oxide may nevertheless cause an inversion layer to form under the thick field oxide, the inversion layer will not extend under the active gate isolation structure.

The fabrication and use of active gate isolation structures in semiconductor integrated circuits has been previously described in U.S. Pat. No. 5,821,600 to Chan, issued Oct. 13, 1998, and U.S. Pat. No. 5,849,614 to Chan, issued Dec. 15, 1998, which are incorporated herein by reference. These patents describe using a first polysilicon layer for the active gate isolation, and a second polysilicon layer for the gate structures of the transistors. These patents further discuss the advantages of isolating active transistor regions using an active gate structure over using conventional thick field oxide isolation.

Figure 1:
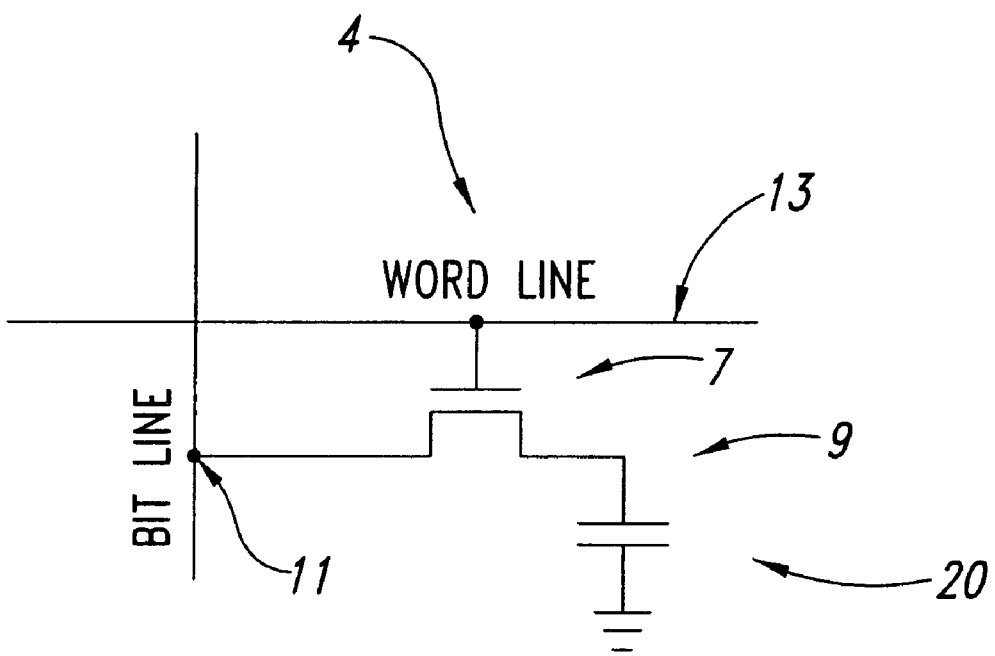
FIG. 1 is a schematic diagram of a conventional DRAM memory cell.

FIG. 1 shows a schematic of a DRAM cell 4 having a transfer gate 7, a storage node 9, a sense node 11 coupled to a bit line, and a word line 13 coupled to a control terminal of the transfer gate. The storage node 9 is represented in FIG. 1 as a capacitor 20. When the transfer gate 7 is activated by the word line 13, the storage node 9 and the sense node 11 are coupled together. Data, stored in the form of electric potential by the capacitor 20, can then be either written to or read from the storage node 9.

Figure 2:
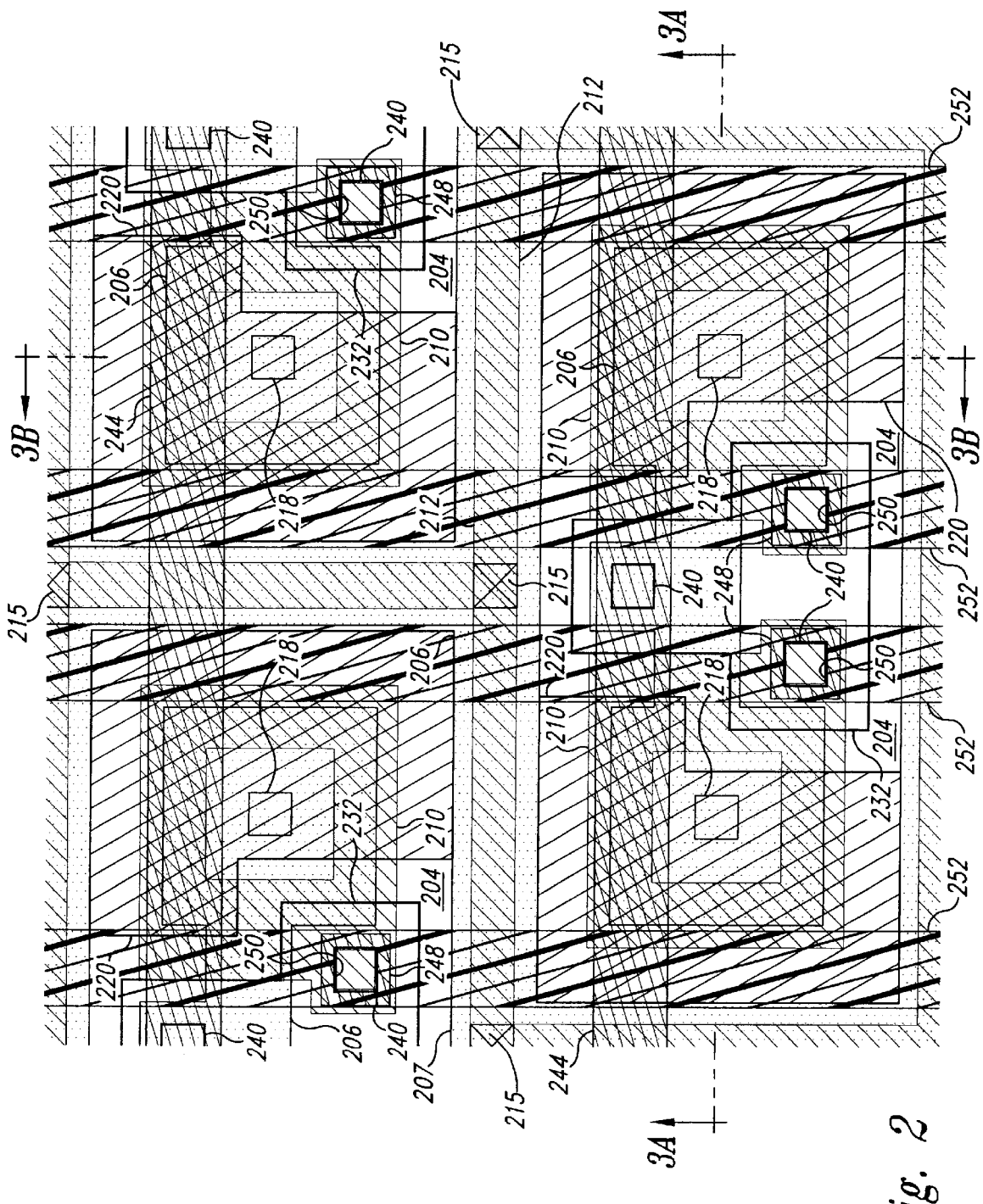
FIG. 2 illustrates a plan view of a DRAM memory cell according to an embodiment of the present invention.

Illustrated in FIG. 2 is a planar layout of a DRAM memory cell 200 according to an embodiment of the present invention. As is conventional in the field of integrated circuit representation, the lateral sizes and thicknesses of the various layers are not drawn to scale and these various layers or layer portions are arbitrarily enlarged to improve drawing legibility.

Active n+ regions 206 and 207 are implanted in a p-well or p-type substrate where thick field oxide isolation regions 204 have not been formed. It can be appreciated that the active n+ regions 206 may be also formed in a larger p-type well or another layer, such as a p-type epitaxial layer. However, in the interests of brevity, the description of the embodiments according to the present invention will refer to only the p-type substrate. A pair of memory cells are formed in each of the active n+ regions 206 and share a common sense node. The active n+ region 207 borders the thick field oxide isolation regions 204, and will be used for active gate isolation purposes. A gate oxide layer and polysilicon layer are deposited over the substrate and etched to form polysilicon gates 210 surrounding the data storage node of each memory cell, and the active gate isolation structure 212 surrounding each active n+ region 206 and over the active n+ region 207. The gates of the transistors and the active gate isolation structure are formed contemporaneously from the same polysilicon layer, and as a result, the gate oxide of the active gate isolation structures will have a thickness similar to the gate oxide of the transistors forming the transfer gates 7. For example, the gate oxide thickness may be between 20 to 300 angstroms thick. Consequently, less charge may be trapped in the thin gate oxide compared to the thick oxide isolation regions 204 resulting in the active gate isolation structures being be less susceptible to adverse influences caused by trapped charges.

As shown in FIG. 2, an oxide isolation regions 204 is adjacent to either side of the active gate isolation structure 212. The active gate isolation structure 212 is coupled to a voltage potential to prevent the conduction channel from forming between adjacent data storage nodes and carrying leakage current. For example, to prevent the formation of a conduction channel in the p-type substrate between the active n+ regions 206 in which the memory cells are formed, the active gate isolation structure 212 will typically be coupled to the lowest voltage supplied on the memory device. Where the well region is also connected to this voltage, the polysilicon gate of the active gate isolation structure 212 may be properly biased by being directly connected to the well regions by metallization layers and/or buried contacts 215. The active gates are coupled to the substrate through a buried contact 215 to provide the voltage. However, it will be appreciated that various methods for connecting the active gate isolation structure 212 to the appropriate voltage potential are well known in the art, and thus, the specific form of the connection should not limit the scope of the present invention.

Contacts 218 are formed through an insulating layer 219 (FIGS. 3A–B) that is deposited subsequent to the polysilicon gate formation. The contacts 218 expose a portion of the active n+ regions 206 that represents the location of the data storage node 9 (FIG. 1). A polysilicon capacitor structure 220 for storing charge at the data storage node 9 is subsequently formed in the contact 218. A conventional stack capacitor may be formed by depositing a polysilicon layer that fills the contact 218, and then etching the resulting polysilicon layer to form the capacitor plates of the individual capacitors for each memory cell. A capacitor dielectric layer 222 (FIGS. 3A–B) and another polysilicon layer 230 are subsequently deposited over the existing structure to complete the stack capacitor structure. The capacitor dielectric layer 222 and the polysilicon layer 230 have been omitted from FIG. 2 for the sake of clarity, but are illustrated in the cross-sections of FIGS. 3A–B. A person of ordinary skill in the art will appreciate that capacitor structures other than a stack capacitor may be used and still remain within the scope of the present invention.

An opening 232 is formed through the polysilicon layer 230, the capacitor dielectric 222, and an insulating layer 231 (FIGS. 3A–B), which is subsequently formed over the polysilicon layer 230. Digit contacts 240 are etched through the insulating layers 231 and 219 to expose a portion of the underlying active region 206, and vias 242 are etched to expose an area of the underlying polysilicon gates 210. The portion of the active n+ region 206 exposed by the digit contacts 240 represent the location of the sense nodes 11 (FIG. 1). A metal layer is formed over the insulating layer 231 and etched to form bit lines 244 and metal regions 248. The metal regions 248 will be used for word lines that will be formed by a subsequent metal layer. Another insulating layer 249 (FIGS. 3A–B) is formed over the bit lines 244 and metal regions 248, and vias 250 are etched to expose the underlying metal regions 248. Another metal layer is formed and then etched to form word lines 252 that will be used to activate a row of polysilicon gates 210.

Figure 3A:
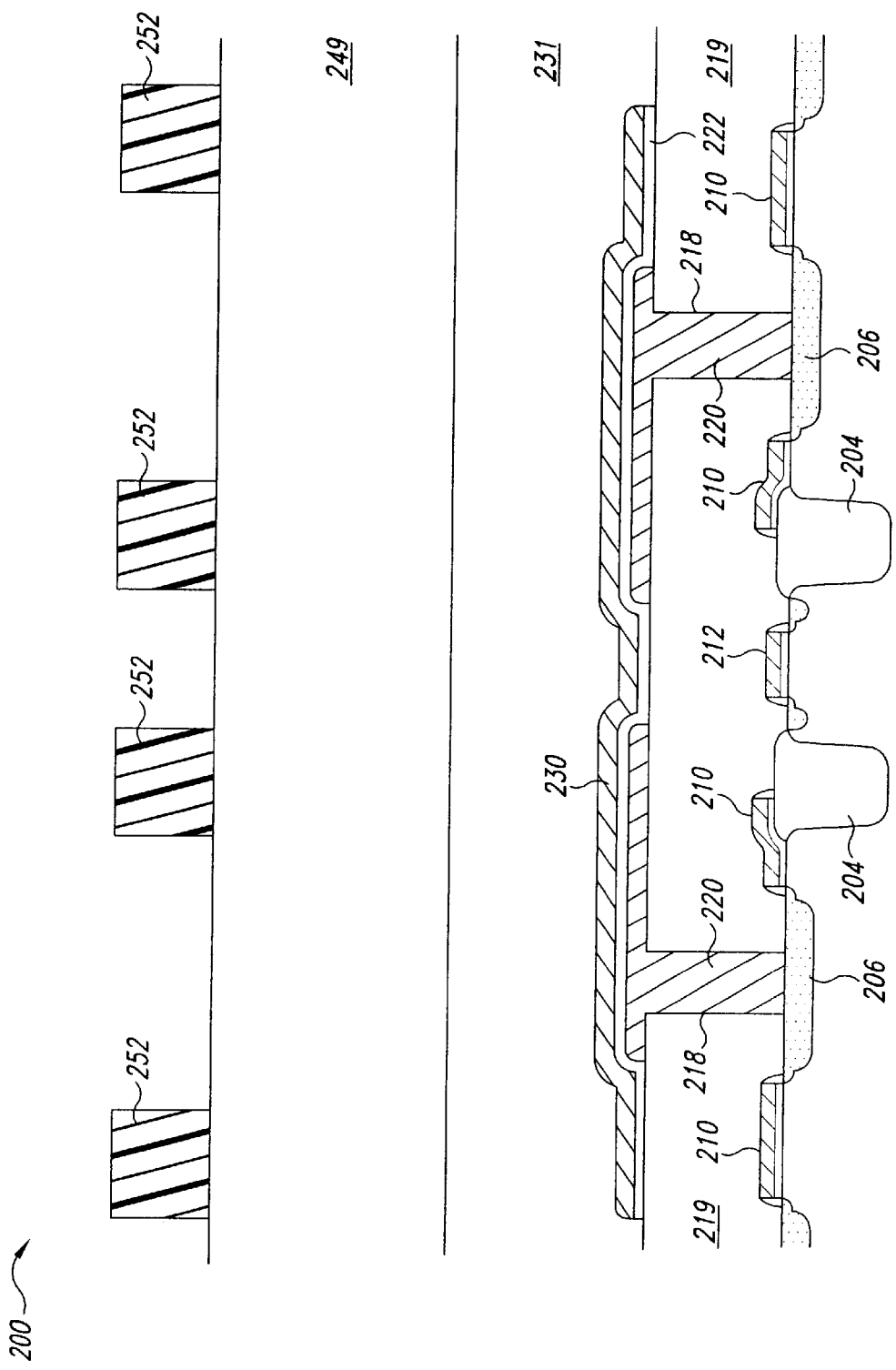
FIGS. 3A–B illustrate cross-section views of the DRAM memory cell shown in FIG. 2.
Figure 3B:
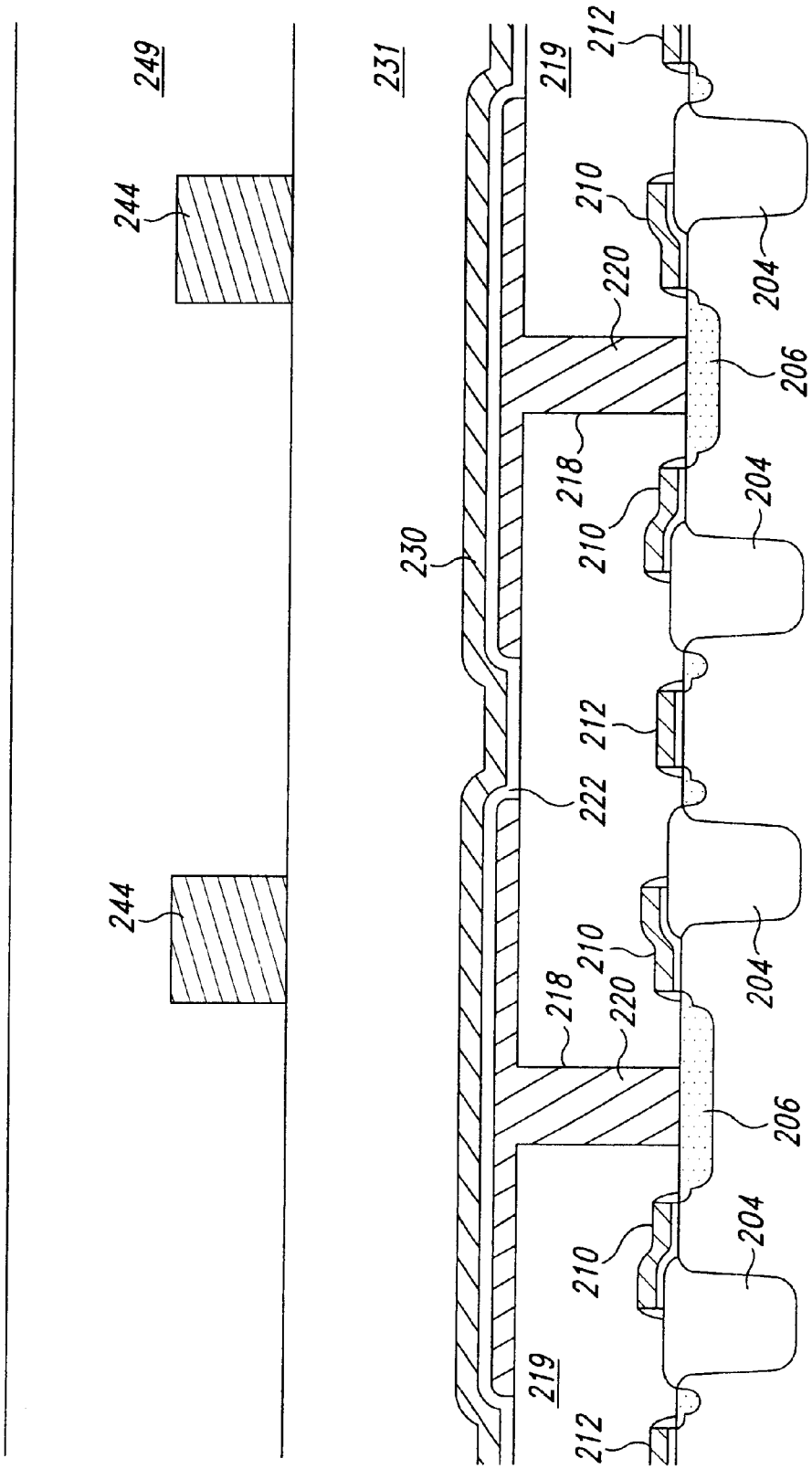

FIGS. 3A–B are cross-sectional diagrams of the DRAM cell 200 through the contacts 218 parallel to the digit line 244, and parallel to the word line 252, respectively. As illustrated in FIGS. 3A–B, a data storage node 9, represented by the contact 218, is isolated from physically adjacent data storage nodes by the thick field oxide isolation region 204, as well as the active gate isolation structure 212. As mentioned previously, the active gate isolation structure 212 is connected to a voltage potential to ensure that a conduction channel will not form in the region under the active isolation structure 212. Thus, even if enough trapped charge accumulates in the thick field oxide isolation regions 204 to create a conduction channel under each respective thick field oxide, leakage currents cannot flow between the contacts 218 (i.e., the data storage nodes 9) of the memory cells formed in adjacent active n+ regions 206 because the region under the active gate isolation structure 212 remains nonconductive.

The polysilicon gates 210 surround the data storage node of the contact 218 to ensure that leakage currents are kept to a minimum. The length of the square shaped polysilicon gates 210, located between the contact 218 and a digit contact 240 represents the gate of a transistor transfer gate for each DRAM cell 200. When the respective word line 252 is activated, data may be written to, or read from, the DRAM cells 200 having transfer gates coupled to that word line 252. The remaining lengths of the polysilicon gate 210 provide additional leakage current protection by preventing any conductive channel from forming when the word line 252 is deactivated. That is, while the word line 252 remains deactivated, the area under the remaining portions of the polysilicon gates 210 are nonconductive, and consequently, provide greater isolation of the data storage nodes of the contacts 218.

As will be appreciated, the main steps for fabricating an embodiment of a DRAM cell according to the present invention are shown and described herein, some steps in the process have not been shown because such standard processing steps are commonly used. Additional processing steps such as threshold adjustment implants, epitaxial growth, well formation, and the like may be carried out as desired. For example, etching steps following the formation of insulating layers may be performed to maintain coplanarity of subsequently formed layers. However, these additional process steps for the formation of these structures are well known in the art.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A semiconductor memory, comprising:

a plurality of active regions formed in a first region;

a plurality of memory cells arranged in a matrix and formed over the plurality of active regions, each memory cell having a data storage node selectively coupled to a sense node by a transfer transistor having a transfer gate;

oxide isolation regions formed between the plurality of active regions to isolate adjacent active regions from each other; and active gate isolation structures formed between the plurality of active regions and adjacent to the oxide isolation regions, the active gate isolation structures electrically coupled to a first voltage to prevent a conduction channel from forming under the active gate isolation structure.

2. The semiconductor memory of claim 1 wherein each memory cell further comprises a semiconductor capacitor structure coupled to the data storage node.

3. The semiconductor memory of claim 1 wherein the transfer gate and the active gate isolation structures are formed from the same polysilicon layer.

4. The semiconductor memory of claim 1 wherein the active gate isolation structures are formed between two oxide isolation regions.

5. The semiconductor memory of claim 1 wherein the first supply voltage comprises a ground.

6. The semiconductor memory of claim 1 wherein the oxide isolation regions comprise shallow trench isolation structures.

7. The semiconductor memory of claim 1 wherein the active region has a first doping type and the first region has a second doping type.

8. The semiconductor memory of claim 7 wherein the first doping type comprises n-type and the second doping type comprises p-type.

9. A dynamic random access memory, comprising a plurality of memory cells, each having a data storage node coupled to a sense node through a transfer gate, the plurality of memory cells formed on a substrate wherein active regions in which the memory cells are formed are separated by oxide isolation regions and active gates formed adjacent to each other, the active gates coupled to a voltage to prevent a conduction channel from forming under the active gates.

10. The dynamic random access memory of claim 9 wherein the transfer gate and the active gates are both formed from a first polysilicon layer.

11. The dynamic random access memory of claim 9 wherein the transfer gates are shaped to surround data storage node regions formed in the active regions.

12. The dynamic random access memory of claim 9 wherein the active gates are coupled to the substrate through a buried contact to provide the voltage.

13. The dynamic random access memory of claim 9, further comprising capacitors coupled to the data storage nodes.

14. The dynamic random access memory of claim 13 wherein the capacitors comprise semiconductor stack capacitors.

15. The dynamic random access memory of claim 9 wherein in the active regions in which the memory cells are formed are n-type and the active gates are coupled to ground.

16. An embedded system, comprising:

an embedded processor to process instructions and data;

an embedded memory coupled to the embedded processor to store instructions and data, the embedded memory comprising:

a plurality of active regions formed in a first region;

a plurality of memory cells arranged in a matrix and formed over the plurality of active regions, each memory cell having a data storage node selectively coupled to a sense node by a transfer transistor having a transfer gate;

oxide isolation regions formed between the plurality of active regions to isolate adjacent active regions from each other; and active gate isolation structures formed between the plurality of active regions and adjacent to the oxide isolation regions, the active gate isolation structures electrically coupled to a first voltage to prevent a conduction channel from forming under the active gate isolation structure.

17. The embedded system of claim 16 wherein each memory cell further comprises a semiconductor capacitor structure coupled to the data storage node.

18. The embedded system of claim 16 wherein the transfer gate and the active gate isolation structures are formed from the same polysilicon layer.

19. The embedded system of claim 16 wherein the first supply voltage comprises a ground.

20. The embedded system of claim 16 wherein the oxide isolation regions comprise shallow trench isolation structures.

21. The embedded system of claim 16 wherein the active region has n-type doping and the first region has a p-type doping.

22. A method for making a semiconductor memory cell array for a semiconductor memory, comprising:

forming active regions on a substrate in which the memory cells are formed;

forming oxide isolation regions and active gates adjacent to each other and between the active regions to isolate the active regions from each other;

coupling the active gates to a first voltage to prevent the formation of a conduction channel under the active gates; and forming memory cells over the active regions, each having a storage node region selectively coupled to a sense node region by a transfer transistor having a transfer gate.

23. The method of claim 22 wherein forming the active gate comprising forming the active gate from a first polysilicon layer.

24. The method of claim 22 wherein forming memory cells comprises:

forming a transfer gate surrounding the data storage node region from the first polysilicon layer; and forming a semiconductor capacitor coupled to the data storage node region.

25. The method of claim 24 wherein the semiconductor capacitor comprises a stack capacitor.

26. The method of claim 22 wherein coupling the active gates to a first voltage comprises coupling the active gates to a conductive interconnect biased at the first voltage.

27. The method of claim 26 wherein the first voltage is ground.

28. The method of claim 22 wherein forming the oxide isolation region comprises forming a shallow trench isolation region.

29. A semiconductor memory, comprising:

a plurality of active regions formed in a first region; and a plurality of memory cells arranged in a matrix and formed over the plurality of active regions, each memory cell having a data storage node selectively coupled to a sense node by a transfer transistor having a transfer gate, the transfer gate surrounding the data storage node.

30. A pair of semiconductor memory cells formed in the common substrate, comprising:

an active region formed in a first region of the substrate, the active region having two memory cells formed within the active region;

a data storage node selectively coupled to a sense node by a transfer transistor having a transfer gate for each of the two transistors, the sense node being common to the two transistors; and active gate isolation structure surrounding the active region and around the two memory cells, the active gate isolation structure being electrically coupled to a first voltage to prevent a conduction channel from forming under the active gate isolation structure.

31. An embedded system, comprising:

an embedded processor to process instructions and data;

an embedded memory coupled to the embedded processor to store instructions and data, the embedded memory comprising:

a plurality of active regions formed in a first region; and a plurality of memory cells arranged in a matrix and formed over the plurality of active regions, each memory cell having a data storage node selectively coupled to a sense node by a transfer transistor having a transfer gate, the transfer gate surrounding the data storage node.

32. An embedded system, comprising:

an embedded processor to process instructions and data;

an embedded memory coupled to the embedded processor to store instructions and data, the embedded memory comprising:

a plurality of active regions formed in a first region;

a plurality of memory cells arranged in a matrix and formed over the plurality of active regions, each memory cell having a data storage node selectively coupled to a sense node by a transfer transistor having a transfer gate, wherein two memory cells are formed in each of the plurality of active regions and the two memory cells share a common sense node;

oxide isolation regions formed between the plurality of active regions to isolate adjacent active regions from each other; and active gate isolation structures formed between the plurality of active regions and adjacent to the oxide isolation regions, the active gate isolation structures electrically coupled to a first voltage to prevent a conduction channel from forming under the active gate isolation structure.

* * * * *